United States Patent [19]
Chao et al.

[11] Patent Number: 6,063,711
[45] Date of Patent: May 16, 2000

[54] HIGH SELECTIVITY ETCHING STOP LAYER FOR DAMASCENE PROCESS

[75] Inventors: Li-Chih Chao, Yang-Mei; Chia-Shiung Tsai, Hsin-Chu; Chu-Yun Fu; Jhon-Jhy Liaw, both of Taipei, all of Taiwan

[73] Assignee: Taiwan Semiconductor Manufacturing Company, Hsin-Chu, Taiwan

[21] Appl. No.: 09/069,456

[22] Filed: Apr. 28, 1998

[51] Int. Cl.[7] .................. H01L 21/304; H01L 21/461; B24B 1/00
[52] U.S. Cl. .................. 438/724; 438/723; 438/740; 216/74
[58] Field of Search .............. 216/74, 79; 438/623, 438/633, 719, 723, 724, 740, 743, 744

[56] References Cited

U.S. PATENT DOCUMENTS

| | | | |
|---|---|---|---|
| 5,260,236 | 11/1993 | Petro et al. | 437/241 |
| 5,269,879 | 12/1993 | Rhoades et al. | 156/643 |
| 5,612,254 | 3/1997 | Mu et al. | 437/195 |
| 5,622,596 | 4/1997 | Armacost et al. | 438/702 |
| 5,635,423 | 6/1997 | Huang et al. | 437/195 |
| 5,652,182 | 7/1997 | Cleeves | 437/195 |

*Primary Examiner*—Richard Bueker
*Assistant Examiner*—Alva C Powell
*Attorney, Agent, or Firm*—George O. Saile; Stephen B. Ackerman

[57] ABSTRACT

A high selectivity etch-stop layer comprising oxynitride is disclosed for forming damascene structures in the manufacturing of semiconductor substrates. Because of its relatively high selectivity to oxides, the oxynitride etch-stop can be made thinner than the conventionally used nitride layer. Therefore, the disclosed oxynitride etch-stop layer makes it possible to avoid the cracking problems of thicker etch-stop layers as well as the associated problems of poor definition of contact or via holes in the damascene structure.

23 Claims, 3 Drawing Sheets

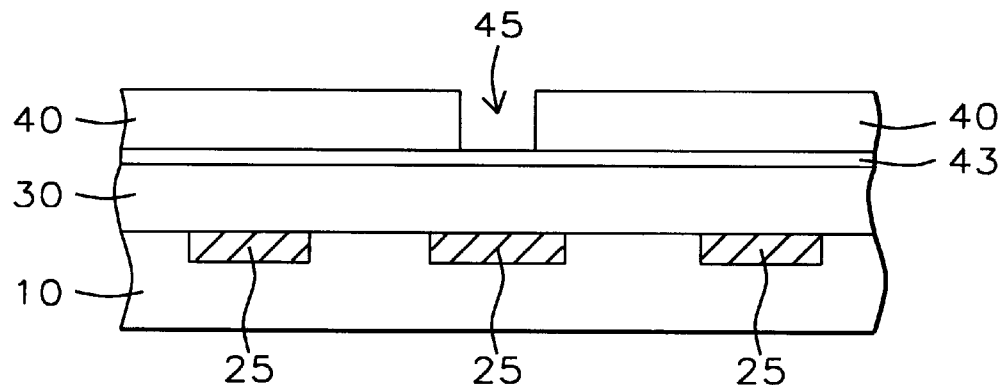
FIG. 1a – Prior Art
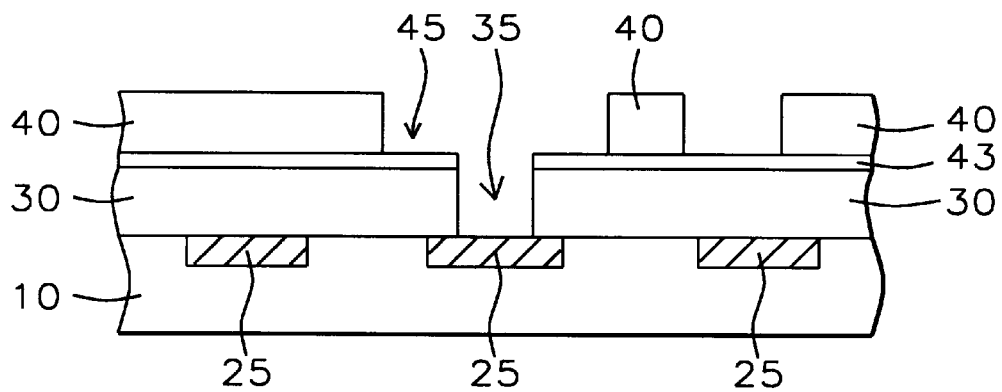
FIG. 1b – Prior Art
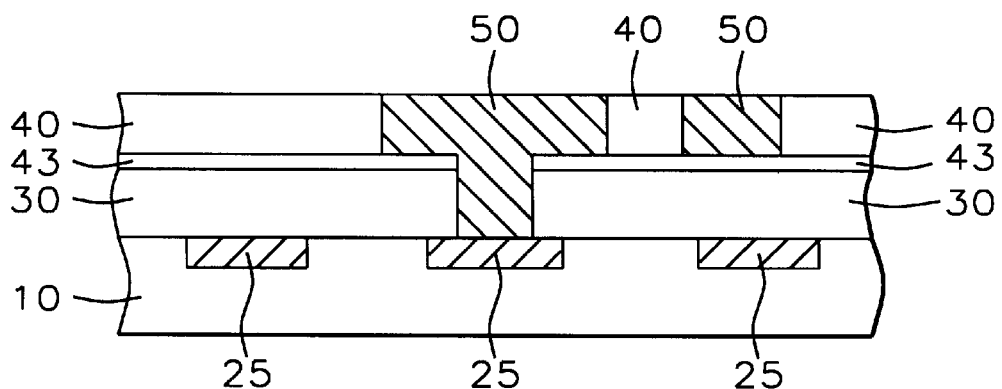
FIG. 1c – Prior Art

HIGH SELECTIVITY ETCHING STOP LAYER FOR DAMASCENE PROCESS

BACKGROUND OF THE INVENTION

(1) Field of the Invention

The present invention relates to the manufacture of ultra large scale integrated (ULSI) circuit chips in general, and in particular, to a high selectivity etching stop layer for damascene process.

(2) Description of the Related Art

Damascene process, which is an adaptation of an old Middle Eastern art form where a work piece was scratched with a sharp tool to form a desired pattern and then filled with gold or silver and the excess metal rubbed off with a piece of rag, is used to great advantage especially in the manufacturing of ultra scale integrated (ULSI) semiconductor devices. Whereas in ancient work, the damascene process was used essentially to form a single layer of a desired pattern—hence a single damascene process—the application of the same process to fabricating a metal layer and the connecting layer together has brought forth the real advantages of what is now called dual damascene process.

It is well known in the art of manufacturing semiconductor substrates that one of the major challenges is the building of multi-levels of metal and insulating layers with accurate registration of one layer with respect to the other. This requires that the layers are extremely flat and well planarized so that the subsequent layers can be optically aligned to the previous layers. As the feature sizes are being scaled down dramatically with the advance of ultra scale registration, it is becoming more and more difficult to fill in between submicron features, such as between metal lines, with insulating materials. Even if they can be filled, the insulating materials formed over features replicate the features themselves to the extent that the resulting surface is not planar. Planarization can be performed in any number of ways, such as reflowing the material, or abrading to a flat surface by polishing, or by chemical mechanical polishing, all of which, still make the resulting surface not flat to the required levels, or that contaminants, and other defects are imparted to the surface from the planarizing equipment and processes. With a damascene process, the starting point is with a flat surface into which trenches and holes are formed by etching, and no further planarization is necessarily required.

Thus, the damascene process itself is a technique where metal interconnections are inlaid in preformed grooves in a substrate, and is usually a preferred method of fabricating interconnections for integrated circuits. In contrast, the more conventional interconnections are formed by blanket depositing a conductive material on an insulation layer such as silicon oxide, and then etching the desired wiring pattern on the layer. The vertical connections between the wiring layers are made separately by forming holes in the insulation layers separating the metallized layers and then filling them with the same or a different conductive material.

Normally, a semiconductor substrate contains passive and active regions having active devices formed near the surface of the semiconductor substrate. The active devices are interconnected through an interlevel conductive layer. One or more metal wiring layers are then formed overlying the interlevel dielectric layer and are separated from each other by additional insulating layers. The wiring stripes are connected to each other and to the devices at the appropriate places by means of holes that are filled with metal through the insulating layers. The holes that connect the metal lines to each other through the insulating layer are called via holes, while the holes that reach the underlying devices through its insulating layer are called contact holes. Typically, the holes are etched into an insulating layer after the latter has been deposited on the semiconductor substrate on which the chips are fabricated. It is common practice to next blanket deposit metal on the insulating layer thereby filling the holes and then forming the metal lines by etching through a patterned photo resist mask formed on the metal layer. For the first metal layer, electrical contact is made with the underlying devices through contact holes, or windows, that allow the metal to descend through the dielectric insulator to the devices. For the second and subsequent wiring layers, the process is repeated and the contact between the metal layers is made through via holes that allow the metal to descend to the lower metal layer(s). It is also common practice to fill the holes separately with metal to form metal plugs first, planarize or smoothen them next with respect to the surface of the insulating layer and then deposit metal layer to make contact with the via plugs and then subtractively etch as before to form the required "personalized" wiring layer.

The more advanced process of forming interconnects with dual damascene is illustrated in FIGS. 1a–1d where, in addition to forming the grooves of single damascene, conductive via openings are also formed. In FIG. 1a of prior art, two layers of insulating layer, that is, lower layer (30) and upper layer, (40), are shown deposited on a first level interconnect metal layer (25) already formed on substrate (10). There is usually an etch stop layer between layers (30) and (40), depicted as reference to numeral (43).

In this conventional dual damascene process, then, insulating layer (30) is coated with a photoresist (not shown) which is exposed through a first mask with image pattern of the via openings (35) and the pattern is anisotropically etched in upper insulating layer (40), that is, down to the etch stop layer. The photoresist now is exposed through a second mask with an image pattern of the conductive line openings, after being aligned with the first mask pattern to encompass the via openings. In anisotropically etching the opening for the conductive ones in the upper insulating layer, the via openings (35) already present in the upper insulating layer are simultaneously etched and replicated in the lower layer of insulating materiel (30). After the etching is complete, both the vias, (35), and line openings, or trenches, (45), are filled with metal (50) as shown in FIG. 1c. Finally, excess metal (50) is removed to arrive at the structure shown in FIG. 1d.

Dual damascene is an improvement over single damascene because it permits the filling of both the trenches and the vias with metal at the same time, thereby eliminating process steps. Although this conventional dual damascene offers advantages over other processes for forming interconnections, it has a number of shortcomings, such as forming and filling the via holes. For example, the edges of via openings in the lower insulating layer, after the second etching, are poorly defined because of the two etchings. It will be apparent to those skilled in the art that etching plays a significant role in a damascene process. The integrity and dimensional control of holes and trenches are governed to a large extent by the etching process that is used, as well as on the materials that are being etched.

Etch stop layer (43) in FIG. 1a is an etch barrier film such as silicon nitride (SiN) to prevent the upper line trench patterns of dual damascene from being etched through subsequent etch steps if the layer underlying the composite insulation layer is for via plug hole or contact isolation. Other barrier films may be used, however silicon nitride is generally preferred because it becomes part of the composite insulation layer and has different etch characteristics than that of silicon dioxide ($SiO_2$) or phosphosilicate glass (PSG) layers that can be used as insulation layers. That is, silicon nitride allows a selective etch process with respect to different underlying materials. Spin-on-glass and CVD nitride are also suitable as etch-stop materials when polyimide layers are used.

Silicon nitride is generally deposited by either high temperature (700–800° C.) low-pressure (LPCVD) technique, or low temperature plasma enhanced (PECVD). However, PECVD silicon nitride tends to be nonstoichiometric, while LPCVD nitride exhibits high tensile stresses, causing cracks for films greater that about 2000 Å. Silicon nitride also exhibits outgassing which result in voids and, therefore, reliability problems. Furthermore, etch rates for silicon nitride are relatively fast so that for relatively low selectivity of silicon nitride to oxides in general, nitride layers must be thick. This results in cracks.

Some of these problems have been addressed in prior art as they relate to semiconductor manufacturing, in general. For example, Armacost, et al., in U.S. Pat. No. 5,662,596 uses a stoichiometrically altered $Si_3N_4$ as an etch stop layer. This etch stop layer is characterized by a nitride formed stoichiometrically with the addition of some materials, such as silicon and hydrogen, which impart improved etch selectivity over $SiO_2$. For damascene processes, in particular, etch stops of specific characteristics need to be developed. Because there are at least two etchings that are required to define both line trenches and interconnect holes in a damascene process, the integrity of the interface where one etch stops and the other starts must be preserved in order to have robust damascene structures with undegraded electrical resistances at the interfaces. In U.S. Pat. No. 5,635,423, Huang, et al., teach a modified dual damascene process where an opening for a via is initially formed in a second insulating layer above a first insulating layer with an etch stop layer therebetween. A larger opening for a trench is then formed in the second insulating layer while simultaneously extending the via opening through the etch stop layer and first insulating layer. He uses commonly used materials such as silicon nitride as the etch stop layer but without any alterations to suit the needs of the dual damascene process. Similarly, Mu, et al., disclose a method of forming an interconnect on a semiconductor substrate, and specifically on a silicon nitride layer. However, none of the prior art address the thickness of the etch stop layer and the concomitant cracking problem.

The present invention discloses a high selectivity etching stop layer with a specific chemistry and smaller thickness so as to prevent cracking during damascene process.

SUMMARY OF THE INVENTION

It is therefore an object of this invention to provide a high selectivity etching stop layer with a specific chemistry and smaller thickness so as to prevent cracking during damascene process.

It is another object of the present invention to provide a damascene process utilizing an etch stop layer having high selectivity formed at a specific temperature.

It is still another object of the present invention to provide a damascene process utilizing an etch stop layer that is etched with a specific recipe.

These objects are accomplished by depositing oxynitride at a specific range of temperature and at a specific range of thickness and then etching the same with a specific recipe.

The objects of the invention are further accomplished by providing a semiconductor substrate having a substructure comprising devices formed in said substrate and a metal layer formed thereon; forming a first intermetal dielectric (IMD) layer over said substrate; forming a high-selectivity etch-stop layer of oxynitride over said first IMD layer; forming a second IMD layer over said etch-stop layer; forming a first photoresist layer over said second IMD layer and patterning said photoresist layer with a mask comprising a line trench pattern; etching through said line trench pattern in said first photoresist layer until said etch-stop layer is reached to form said line trench pattern into said second IMD layer; removing said first photoresist layer; forming a second photoresist layer over said second IMD layer including said line trench in said second IMD layer; patterning said second photoresist layer with a mask comprising a via hole pattern; etching through said via hole pattern in said second photoresist layer into said etch-stop layer, thus forming a via hole opening in said etch-stop layer; etching further through said via hole opening in said etch-stop layer to form said via hole pattern into said first IMD layer; removing said second photoresist layer; depositing metal in said line trench and said via hole composite structure; and removing said metal from the surface of said substrate for subsequent process steps to complete the fabrication of a semiconductor substrate.

In a second embodiment, the disclosed high selectivity oxynitride etching stop layer is applied to a damascene structure where hole pattern is first formed in the etch-stop layer, and then the second intermetal dielectric (IMD) Layer is formed with line trench. The line trench and via hole pattern is etched with one step and the resulting composite damascene is filled with metal.

BRIEF DESCRIPTION OF THE DRAWINGS

FIGS. 1a–1c show the forming of a dual damascene structure according to prior art.

DESCRIPTION OF THE PREFERRED EMBODIMENTS

Referring now the drawings, in particular to FIGS. 2a–2f and FIGS. 3a–3f, there is shown a dual damascene process utilizing a highly selective etching stop layer.

Figure 2A:
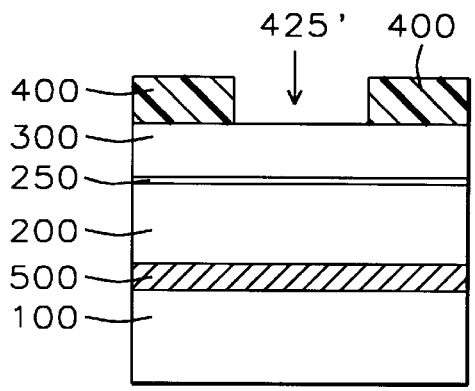
FIG. 2a shows the forming of a first intermetal dielectric (IMD) layer and a second (IMD) layer separated by an intervening etch-stop layer on a semiconductor substrate according to this invention.

FIG. 2a shows a portion of a semiconductor substrate (100), preferably silicon, provided with a substructure of devices formed in the substrate and/or metal layers thereof, and as they are not significant to the invention, they are not described in detail in order not to unnecessarily obscure the present invention. Metal layer (500) in FIG. 2a represents a lower metal interconnect layer which is to be interconnected to an upper metal layer to be formed. A first intermetal dielectric (IMD) layer, (200), is formed on substrate (100) of FIG. 2a. As is well known in the art, blanket dielectric layers may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, the blanket first IMD layer has a thickness between about 5,000 to 15,000 Å, and can be a borophosphosilicate glass (PSG), or, preferably, a borophosphorous oxide (BPTEOS) formed by the decomposition of tetraethyl orthosilicate (TEOS using plasma enhanced chemical vapor deposition (PECVD).

As a main feature and key aspect of the present invention, a high-selectivity etching stop layer (250) is next formed over first IMD layer (200) shown in FIG. 2a. Layer (250) will later be used to stop etching when etching patterns into the insulator dielectric layers. The etch-stop material is oxynitride formed by reacting $SiH_4$ with $N_2O$ and $NH_3$ through chemical vapor deposition. In order to achieve the required etching selectivity with respect to BPTEOS oxide layer (200), it is critical that the deposition of the oxynitride is performed at a temperature between about 300 to 400° C.

Etching experiments were performed in a High Density Plasma (HDP)5300 etcher (made by Applied Materials Co.) using gases $C_4F_8$, $CH_3F$ and Ar at flow rates, respectively, between about 10 to 11 sccm, 5 to 7 sccm and 50 to 60 sccm. The resulting etch rates for oxide, oxynitride and nitride were, respectively, 7000 Å/min, 650 Å/min, and 800 Å/min, thus yielding selectivity rates of oxynitride:oxide ≈1:11, nitride:oxide ≈1:9. On a separate experiment in MXP+ reactive etcher (made by Applied Materials Co.,) and using gases $CHF_3$, $CF_4$ and Ar at flow rates between about 80 to 90 sccm, 20 to 30 sccm and 180 to 200 sccm, respectively, with 190–210 millitorr pressure, and 625 to 675 watts, the etching rates for oxynitride was found to be 470 Å/min in comparison with 760 Å/min for nitride, thus yielding even higher selectivities of oxynitride to oxide.

Because of the higher selectivity with respect to the oxynitride, it will be apparent to those skilled in the art that an etch-stop layer comprising oxynitride can be made thinner than conventionally used nitride with the attendant advantage of less cracking problems. Hence, it is preferred that the thickness of oxynitride etch-stop layer (250) of this invention is between about 500 to 1500 Å.

The next layer of dielectric, (300), shown in FIG. 2a is second intermetal dielectric (IMD) layer that is formed above the first IMD layer and below a metal layer that will be formed subsequently. The second IMD layer has a thickness between about 5000 to 15000 Å, and can be a phosphosilicate glass (PSG), or, preferably, borophosphorous oxide (BPTEOS) formed by the decomposition of tetraethyl orthosilicate (TEOS) using plasma enhanced chemical vapor deposition (PECVD).

Figure 2B:
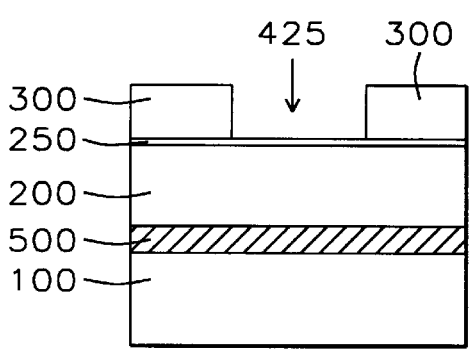
FIG. 2b shows the forming of a line trench in the second IMD layer of FIG. 2a, according to this invention.
Figure 2C:
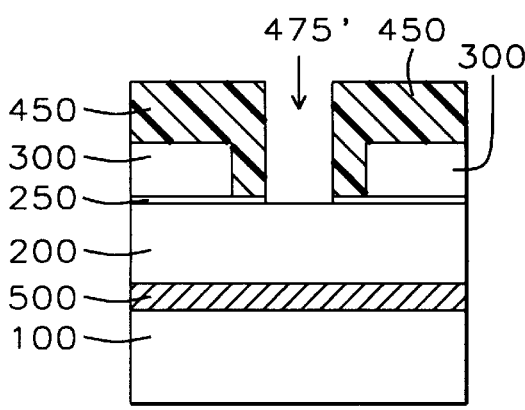
FIG. 2c shows the forming of a via hole opening in the etch-stop layer of FIG. 2b, according to this invention.

A first layer of photoresist, (400) is formed over second IMD layer (300) at a thickness between about 1.0 to 1.2 micrometers (μm) and then patterned with a mask having images of a line trench (425'). Line trench (425) shown in FIG. 2b is formed by etching line trench pattern (425') in the first photoresist layer into second IMD layer (300) until etch-stop layer (250) is reached. The etching is accomplished preferably with a recipe comprising gases $C_4F_8$ with a flow rate between about 10 to 11 sccm, $CH_3F$ between about 5 to 7 sccm, argon between about 50 to 60 sccm.

Figure 2D:
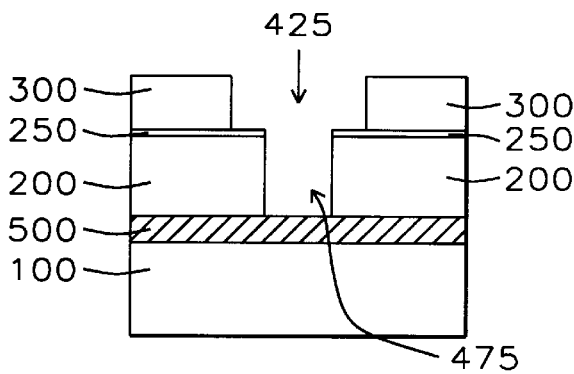
FIG. 2d shows the forming of via hole of FIG. 2c in the first IMD layer, according to this invention.

A second photoresist layer (450) is formed over second IMD layer (300) including line trench (425) and then patterned with a mask having images of a via hole. The portion of etch-stop layer (250) at the bottom of hole (475') is next etched using a recipe comprising gases $CF_4$, $CHF_3$, Ar at flow rates between about 80 to 90 sccm, 10 to 20 sccm, 180 to 200 sccm, respectively. After the removal of the portion of oxynitride layer (250) from the bottom of trench (425) shown in FIG. 2c, hole pattern (475') is transferred into first IMD layer (200) by using an etch recipe comprising gases $CF_4$, $CHF_3$ and Ar at flow rates between about 20 to 30 sccm, 80 to 90 sccm, and 180 to 200 sccm, respectively, as shown in FIG. 2d. After the etching of via hole (475), the hole is sputter etched so as to clean the metal surface, (500), exposed at the bottom of the hole.

Figure 2E:
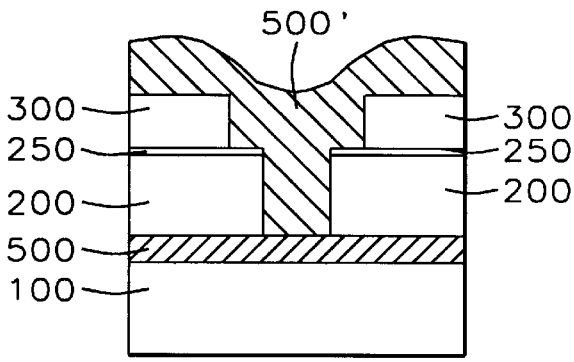
FIG. 2e shows the metal filling of the composite damascene structure of FIG. 2d, according to this invention.
Figure 2F:
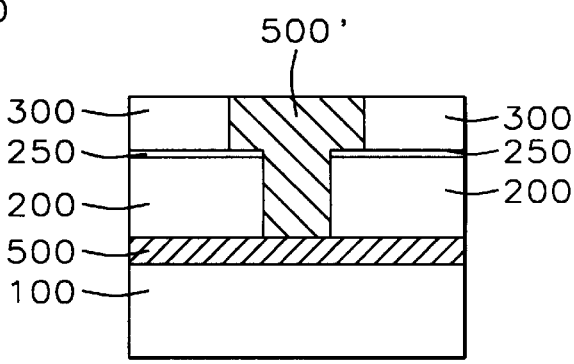
FIG. 2f shows the removal of excess metal of FIG. 2e in preparation for the subsequent steps of completing the semiconductor substrate of this invention.

It will be observed in FIG. 2d that the composite structure comprising line trench (425) and via hole (475) together with the oxynitride etch-stop layer, form the damascene structure of this invention. A metal, preferably, tungsten, (500'), is next deposited into this new damascene structure as shown in FIG. 2e. Finally, chemical mechanical polishing is performed in order to planarize the metal/second IMD surface for subsequent process steps to complete the fabrication of the semiconductor substrate. The resulting structure is shown in FIG. 2f.

In a second embodiment, a dual damascene structure is formed using the high selectivity etching stop layer of this invention with altered process steps where a via hole opening is first formed in the etch-stop layer prior to forming the second intermetal dielectric (IMD) layer as shown in FIGS. 3a–3f.

Figure 3A:
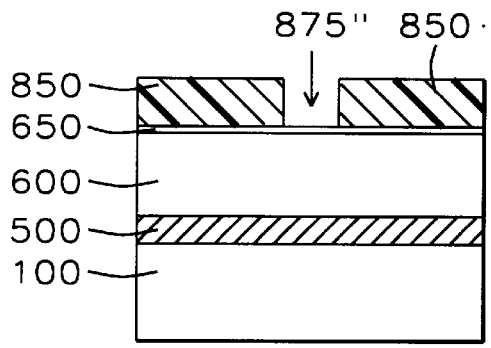
FIG. 3a shows the forming of the first intermetal dielectric (IMD) layer and the oxynitride etch-stop layer of this invention.

FIG. 3a shows a portion of a semiconductor substrate (100), preferably silicon, provided with a substructure of devices formed in the substrate and/or metal layers thereof, and as they are not significant to the invention, they are not described in detail in order not to unnecessarily obscure the present invention. Metal layer (500) in FIG. 3a represents a lower metal interconnect layer which is to be interconnected to an upper metal layer to be formed. A first intermetal dielectric (IMD) layer, (600), is formed on substrate (100) of FIG. 3a. For the preferred embodiment of the present invention, the blanket first IMD layer has a thickness between about 5000 to 15000 Å, and can be a borophosphosilicate glass (PSG), or, preferably, a borophosphorous oxide (BPTEOS) formed by the decomposition of tetraethyl orthosilicate (TEOS) using plasma enhanced chemical vapor deposition (PECVD).

As a main feature and key aspect of the present invention, a high-selectivity etching stop layer (650) is next formed over first IMD layer (600) shown in FIG. 3a. Layer (250) will later be used to stop etching when etching patterns into the insulator dielectric layers. The etch-stop material is oxynitride formed by reacting $SiH_4$ with $N_2O$ and $NH_3$ through chemical vapor deposition. In order to achieve the required etching selectivity with respect to BPTEOS oxide layer (600), it is critical that the deposition of the oxynitride is performed at a temperature between about 300 to 400° C.

Etching experiments were performed in a High Density Plasma (HDP)5300 etcher (made by Applied Materials Co.,) using gases $C_4F_8$, $CH_3F$ and Ar at flow rates, respectively, between about 10 to 11 sccm, 5 to 7 sccm and 50 to 60 sccm. The resulting etch rates for oxide, oxynitride and nitride were, respectively, 7000 Å/min, 650 Å/min, and 800 Å/min, thus yielding selectivity rates of oxynitride:oxide≈1:11, nitride:oxide≈1:9. On a separate experiment in MXP+ reactive etcher (made by Applied Materials Co.,) and using gases $CHF_3$, $CF_4$ and Ar at flow rates between about 80 to 90 sccm, 20 to 30 sccm and 180 to 200 sccm, respectively, with 190–210 millitorr pressure, and 625 to 675 watts, the etching rates for oxynitride was found to be 470 Å/min in comparison with 760 Å/min for nitride, thus yielding even higher selectivities of oxynitirede to oxide.

Because of the higher selectivity with respect to the oxynitride, it will be apparent to those skilled in the art that an etch-stop layer comprising oxynitride can be made thinner than conventionally used nitride with the attendant advantage of less cracking problems. Hence, it is preferred that the thickness of oxynitride etch-stop layer (250) of this invention is between about 500 to 1500 Å.

Figure 3D:
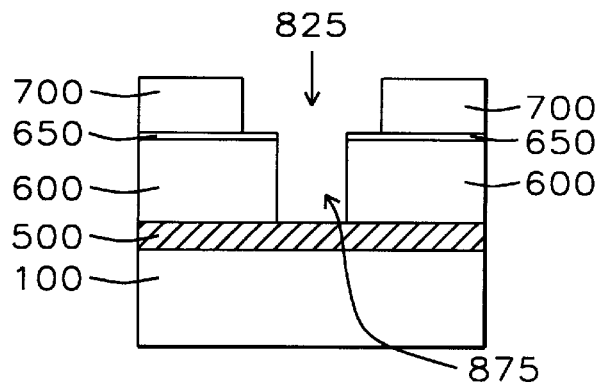
FIGS. 3c–3d show the forming of the line trench and via hole composite damascene structure of this invention.
Figure 3B:
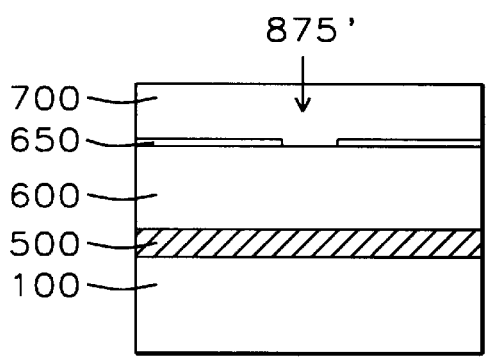
FIG. 3b shows the forming of a via hole opening in the etch-stop layer of this invention, and the subsequent forming of the second IMD layer.

A first photoresist layer (850) is next formed over etch-stop layer (650) and then patterned with a mask having images of a via hole. The portion of etch-stop layer (650) at the bottom of hole (875") is next etched using a recipe comprising gases $CF_4$, $CHF_3$ and Ar at flow rates between about 80 to 90 sccm, 10 to 20 sccm, 180 to 200 sccm, respectively, thus forming a via hole opening in the etch-stop layer. Subsequently, first photoresist layer (800) is removed and a second IMD layer (700) is formed over the substrate, including the via hole opening, as shown in FIG. 3b. It is preferred that the blanket second IMD layer has a thickness between about 5000 to 15000 Å, and that it is a borophosphosilicate glass (PSG), or, preferably, a borophosphorous oxide (BPTEOS) formed by the decomposition of tetraethyl orthosilicate (TEOS) using plasma enhanced chemical vapor deposition (PECVD).

Figure 3E:
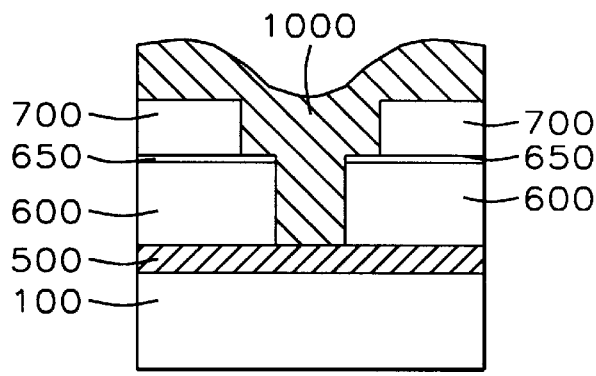
FIGS. 3e–3f show the metal filling of the composite damascene structure of FIG. 3d, according to this invention.
Figure 3C:
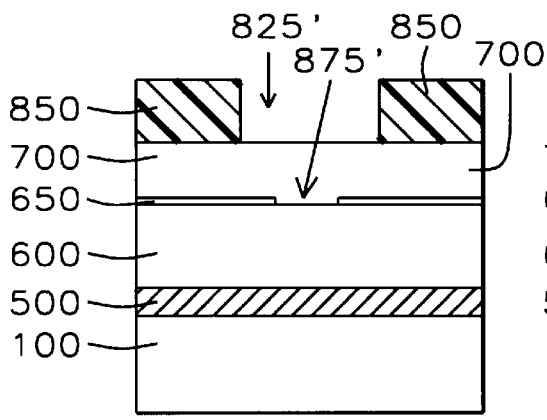

A second photoresist layer (900) is next formed over second IMD layer (700) at a thickness between about 08. to 1.2 μm, and then patterned with a mask having images of a line trench (825'). Line trench shown in FIG. 3c is formed by etching line trench pattern (825'). Line trench (825) shown in FIG. 3d is formed by etching line trench pattern (825') in the second photoresist layer into second IMD layer (700) until etch-stop layer (650) is reached, and continuing further to simultaneously transfer the via hole pattern in the etch-stop layer into first IMD layer (600) until lower level metal layer (1000) is reached. The etching is accomplished preferably with a recipe comprising gases $C_4F_8$ with a flow rate between about 10 to 11 sccm, $CHF_3$ between about 5 to 7 sccm, Ar between about 50 to 60 sccm.

Figure 3F:
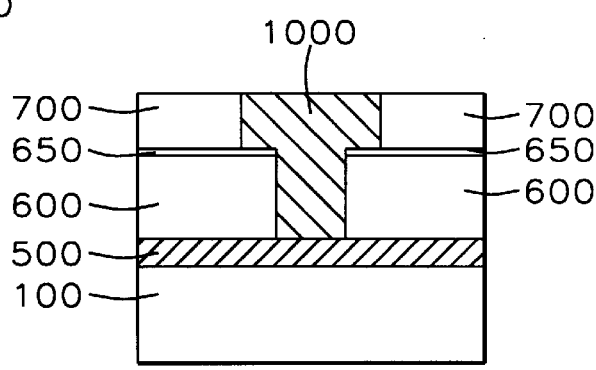

It will be observed in FIG. 3d that the composite structure comprising line trench (825) and via hole (875) together with the oxynitride etch-stop layer, form the damascene structure of this invention. A metal, preferably, tungsten is next deposited into this new damascene structure as shown in FIG. 3e. Finally, chemical mechanical polishing is performed in order to planarize the metal/second IMD surface for subsequent process steps to complete the fabrication of the semiconductor substrate. The resulting structure is shown in FIG. 3f.

While the invention has been particularly shown and described with reference to the preferred embodiments thereof, it will be understood by those skilled in the art that various changes in form and details may be made without departing from the spirit and scope of the invention.

What is claimed is:

1. A method of forming a dual damascene structure utilizing a highly selective etching stop layer comprising the steps of:

providing a semiconductor substrate having a substructure comprising devices formed in said substrate and a metal layer formed thereon;

forming a first intermetal dielectric (IMD) layer over said substrate;

forming a high-selectivity etch-stop layer over said first IMD layer, wherein said forming said high-selectivity etch-stop layer is accomplished by reacting $SiH_4$ with $N_2O$ and $NH_3$ at a temperature between about 300 to 40° C. through chemical vapor deposition (CVD) to form oxynitride having a thickness between about 500 to 1,500 Å;

forming a second IMD layer over said etch-stop layer;

forming a first photoresist layer over said second IMD layer and patterning said photoresist layer with a mask comprising a line trench pattern;

etching through said line trench pattern in said first photoresist layer until said etch-stop layer is reached to form said line trench pattern into said second IMD layer;

removing said first photoresist layer;

forming a second photoresist layer over said second IMD layer including said line trench in said second IMD layer;

patterning said second photoresist layer with a mask comprising a via hole pattern;

etching through said via hole pattern in said second photoresist layer into said etch-stop layer, thus forming a via hole opening in said etch-stop layer, wherein said etching is accomplished with a recipe comprising gases $CF_4$ with a flow rate between about 80 to 90 sccm, $CHF_3$ between about 10 to 20 sccm, and Ar between about 180 to 200 sccm;

etching further through said via hole opening in said etch-stop layer to form said via hole pattern into said first IMD layer;

removing said second photoresist layer;

depositing metal in said line trench and said via hole composite structure; and removing said metal from the surface of said substrate for subsequent process steps to complete the fabrication of a semiconductor substrate.

2. The method of claim 1, wherein said first IMD layer comprises borophosphorous oxide (BPTEOS).

3. The method of claim 2, wherein said first IMD layer has a thickness between about 5,000 to 15,000 Å.

4. The method of claim 1, wherein said second IMD layer comprises borophosphorous oxide (BPTEOS).

5. The method of claim 4, wherein said second IMD layer has a thickness between about 5,000 to 15,000 Å.

6. The method of claim 1, wherein said first photoresist layer has a thickness between about 1.0 to 1.2 micrometers (μm).

7. The method of claim 1, wherein said etching through said line trench pattern in said first photoresist layer into said second IMD layer until said etch-stop layer is reached is accomplished with a recipe comprising gases $C_4F_8$ with a flow rate between about 10 to 11 sccm, $CH_3F$ between about 5 to 7 sccm, Ar between about 50 to 60 sccm.

8. The method of claim 1, wherein said second photoresist layer has a thickness between about 1.0 to 1.2 micrometers (μm).

9. The method of claim 1, wherein said etching further through said via hole opening in said etch-stop layer into said first IMD layer is accomplished with a recipe comprising gases $CF_4$, $CHF_3$ and Ar at flow rates between about 20 to 30 sccm, 80 to 90 sccm, and 180 to 200 sccm, respectively.

10. The method of claim 1, wherein said forming metal in said line trench and said contact hole composite structure is accomplished with chemical vapor deposition.

11. The method of claim 1, wherein said removing said metal from the surface of said substrate is accomplished by chemical mechanical polishing.

12. A method of forming a dual damascene structure utilizing a highly selective etching stop layer comprising the steps of:

providing a semiconductor substrate having a substructure comprising devices formed in said substrate and a metal layer formed thereon;

forming a first intermetal dielectric (IMD) layer over said substrate;

forming a high-selectivity etch-stop layer over said first IMD layer, wherein said forming said high-selectivity etch-stop layer is accomplished by reacting $SiH_4$ with $N_2O$ and $NH_3$ at a temperature between about 300 to 40° C. through chemical vapor deposition (CVD) to form oxynitride having a thickness between about 500 to 1,500 Å;

forming a first photoresist layer over said etch-stop layer and patterning said photoresist layer with a mask comprising a via hole pattern;

etching through said via hole pattern in said second photoresist layer into said etch-stop layer, thus forming a via hole opening in said etch-stop layer, wherein said etching is accomplished with a recipe comprising gases $CF_4$ with a flow rate between about 80 to 90 sccm, $CHF_3$ between about 10 to 20 sccm, and Ar between about 180 to 200 sccm;

removing said first photoresist layer;

forming a second IMD layer over said etch-stop layer;

forming a second photoresist layer over said second IMD layer and over said etch-stop layer having said via hole opening, and patterning said photoresist layer with a mask comprising a line trench pattern;

etching through said line trench pattern in said second photoresist layer to form said line trench pattern into said second IMD layer until said etch-stop layer is reached;

etching further through said via hole opening in said etch-stop layer to form said via hole pattern in said etch-stop layer into said first IMD layer;

removing said second photoresist layer;

depositing metal in said line trench and said via hole composite structure; and removing said metal from the surface of said substrate for subsequent process steps to complete the fabrication of a semiconductor substrate.

13. The method of claim 12, wherein said first IMD layer is borophosphorous oxide (BPTEOS).

14. The method of claim 13, wherein said first IMD layer has a thickness between about 5,000 to 15,000 Å.

15. The method of claim 12, wherein said first photoresist layer over said etch-stop layer has a thickness between about 1.0 to 1.2 micrometers ($\mu$m).

16. The method of claim 12, wherein said first photoresist layer is removed by oxygen ashing.

17. The method of claim 12, wherein said second IMD layer comprises borophosphorous oxide (BPTEOS).

18. The method of claim 17, wherein said second IMD layer has a thickness between about 5,000 to 15,000 Å.

19. The method of claim 12, wherein said second photoresist layer over said second IMD layer has a thickness between about 1.0 to 1.2 micrometers ($\mu$m).

20. The method of claim 12, wherein said etching through said line trench pattern in said second photoresist layer into said second IMD layer until said etch-stop layer is reached is accomplished with a recipe comprising gases $C_4F_8$ with a flow rate between about 10 to 11 sccm, $CH_3F$ between about 5 to 7 sccm, and Ar between about 50 to 60 sccm.

21. The method of claim 12, wherein said etching further through said via hole opening in said etch-stop layer to form said via hole pattern into said first IMD layer is accomplished with a recipe comprising gases $C_4F_8$, $CH_3F$ and Ar at flow rates between about 10 to 11 sccm, 5 to 6 sccm, and 50 to 60 sccm, respectively.

22. The method of claim 12, wherein said forming metal in said line trench and said contact hole composite structure is accomplished with chemical vapor deposition.

23. The method of claim 12, wherein said removing said metal from the surface of said substrate is accomplished by chemical mechanical polishing.

\* \* \* \* \*